United States Patent [19]
Furuyama

[11] Patent Number: 5,386,127
[45] Date of Patent: Jan. 31, 1995

[54] SEMICONDUCTOR DEVICE HAVING GROUPS OF PADS WHICH RECEIVE THE SAME SIGNAL

[75] Inventor: Tohru Furuyama, Tokyo, Japan

[73] Assignee: Kabushiki Kaisha Toshiba, Kawasaki, Japan

[21] Appl. No.: 248,536

[22] Filed: May 24, 1994

Related U.S. Application Data

[63] Continuation of Ser. No. 64,368, May 21, 1993, abandoned, which is a continuation of Ser. No. 691,420, Apr. 25, 1991, abandoned.

[30] Foreign Application Priority Data

Apr. 25, 1990 [JP]  Japan ................................ 2-107542

[51] Int. Cl.⁶ ............................................ H01L 27/02
[52] U.S. Cl. ........................................ 257/48; 257/786
[58] Field of Search ..................... 357/40, 71, 45; 307/440; 257/786, 48, 203, 208

[56] References Cited

U.S. PATENT DOCUMENTS

| | | | |
|---|---|---|---|
| 4,413,271 | 11/1983 | Gontowski, Jr. et al. | 357/40 |
| 4,833,620 | 5/1989 | Takahashi | 357/40 |
| 4,884,122 | 11/1989 | Eichelberger et al. | 357/71 |
| 4,974,053 | 11/1990 | Kinoshita | 357/68 |
| 5,008,727 | 4/1991 | Katsura et al. | 357/40 |
| 5,083,181 | 1/1992 | Yoshida | 357/45 |

FOREIGN PATENT DOCUMENTS

| | | |
|---|---|---|
| 0317963 | 5/1989 | European Pat. Off. . |
| 3712178 | 10/1987 | Germany . |
| 59-188956 | 10/1984 | Japan . |
| 60-240140 | 11/1985 | Japan . |
| 61-253847 | 4/1987 | Japan . |
| 62-271443 | 11/1987 | Japan . |
| 63-128729 | 8/1988 | Japan . |
| 88106881 | 11/1989 | Japan . |
| 88252318 | 4/1990 | Japan . |

OTHER PUBLICATIONS

Mavor, et al., "Introduction to MOS LSI Design", 1983, Addison-Wesley, London, pp. 8–13, Plates 2–4.
"Protecting Si Wafers Against Damage During Testing", IBM Technical Disclosure Bulletin, vol. 32, No. 4A, Sep. 1989, p. 121.
Pearson, "Masterplan (A Simplified Method of Design)", Proceedings of the 1st International Conference on Semi-Custom ICs, Nov, 1981, pp. 201–213.

Primary Examiner—Rolf Hille
Assistant Examiner—Roy Potter
Attorney, Agent, or Firm—Banner, Birch, McKie & Beckett

[57] ABSTRACT

A semiconductor device comprises a bonding pad serving as a power supply terminal and a plurality of bonding pads having the same function and serving as one of grouped terminals other than the power supply terminal.

24 Claims, 6 Drawing Sheets

SEMICONDUCTOR DEVICE HAVING GROUPS OF PADS WHICH RECEIVE THE SAME SIGNAL

This application is a continuation of application Ser. No. 08/064,368, filed May 21, 1993, now abandoned, which is a continuation of application Ser. No. 07/691,420, filed Apr. 25, 1991 now abandoned.

BACKGROUND OF THE INVENTION

1. Field of the Invention

The present invention relates to a semiconductor device and, more particularly, to a bonding pad.

2. Description of the Related Art

In a process of manufacturing a semiconductor integrated circuit, generally, non-defective chips are selected and defective chips are marked by a die sort test after manufacture process of a wafer, and then the non-defective chips are packaged into a finished product. In this manufacturing process, the needle of a probe card of a prober may be brought into contact with a bonding pad on an integrated circuit chip region of the wafer except when the die sort test is carried out. For example, a bonding pad, which is connected to word Lines of a memory integrated circuit through switching elements, is formed and, before the die sort test is performed, a voltage is applied to the bonding pad by bringing the needle of the probe card into contact with the bonding pad and a voltage stress is applied to the word lines through the switching elements, thereby screening defective memory cells.

The more frequently the needle of the probe card contacts the bonding pad on the wafer before integrated circuit chips are packaged, the worse the yield of wire bonding and, accordingly, the worse the yield of assembly.

SUMMARY OF THE INVENTION

An object of the present invention is to provide a semiconductor device capable of resolving the above-described problem in which the yield of assembly deteriorates as the contact of the needle of a probe card with a bonding pad increases in number.

To attain the above object, there is provided a semiconductor device comprising a plurality of bonding pads having the same function and serving as one of grouped terminals other than a power supply terminal.

According to the present invention, the bonding pads are selectively used from the end of the manufacture process of wafers to the assembly process, and the number of times of contact of the needle of the probe card with the bonding pads, which are used (to which wires are bonded) in the assembly process, is less than that in the conventional semiconductor device. The yield of assembly is thus improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the present invention will be described with reference to the accompanying drawings, in which the same components are designated by the same reference numerals.

Figure 1:
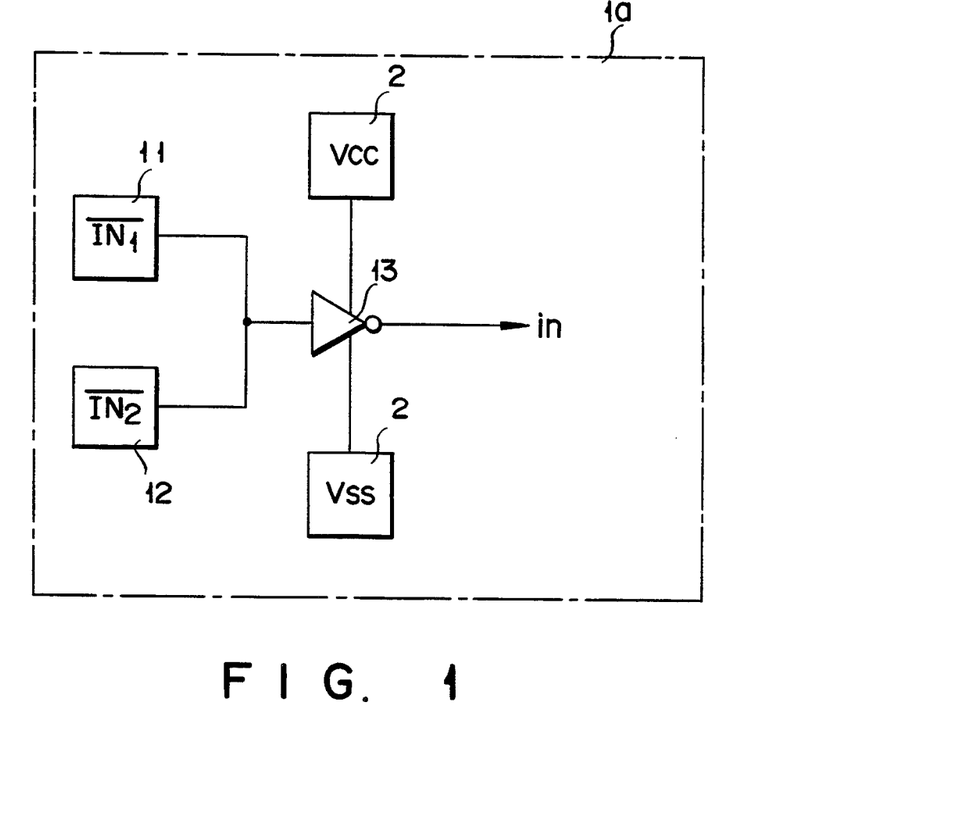
FIG. 1 is a circuit diagram partially showing a DRAM according to a first embodiment of the present invention.

FIG. 1 is a circuit diagram partially showing a dynamic random access memory (DRAM) according to the first embodiment of the present invention.

Bonding pads 2 serving as power supply terminals for receiving power supply potential $V_{CC}$ and ground potential $V_{SS}$, grouped terminals other than the power supply terminals, and various types of circuits are formed on a chip 1a of the DRAM. A plurality of bonding pads (first pad 11 and second pad 12) is formed to function as one of the grouped terminals. The pads 11 and 12 are connected in common to an input terminal of an input buffer circuit (e.g., inverter circuit).

In the DRAM shown in FIG. 1, when an input signal $\overline{IN1}$ is supplied to the first pad 11, an output signal in of the input buffer circuit 13 is supplied to an internal circuit (not shown) of the DRAM as an input signal. When an input signal $\overline{IN2}$ is supplied to the second pad 12, the output signal in of the input buffer circuit 13 is supplied to the internal circuit of the DRAM.

In the manufacturing process of the DRAM, when a test other than the die sort test (for example, screening of defective memory cells) is carried out for DRAM chip regions on a wafer from the end of the manufacture process of wafers to the assembly process, the probe card is put into contact with the second pad 12 to apply a signal or a voltage thereto and, in this case, the first pad 11 is not used. In the assembly process of the DRAM, wires are bonded to the first pad 11 and, in this case, the second pad 12 is not used when the die sort test is performed, either the first pad 11 or the second pad 12 can be used.

A row address strobe (RAS) terminal receiving a RAS signal, is used as one of the foregoing pads for use in the screening of defective cells on the wafer. In a normal DRAM, if the RAS signal is inactivated, a bit line precharge signal generator circuit is activated to generate a bit line precharge signal. The bit line precharge signal generator circuit is thus turned on, and all bit lines of a memory cell array are precharged with a predetermined bit line potential. If the RAS signal is activated, a word line is selected in response to an address signal. It is therefore necessary to inactivate the RAS signal input to the RAS terminal when an operating power supply voltage is applied to the DRAM chip regions on the wafer and the screening test for defective memory cells is carried out in a conductive state of the bit line precharge signal generator circuit.

In the normal DRAM, all word lines of the memory cell array are automatically and sequentially selected by designating a column address strobe (CAS) before RAS refresh mode. If an operating power supply voltage is applied to the DRAM chip regions on the wafer to activate a CAS signal and a RAS signal in sequence and thus the CAS before RAS refresh mode is designated, a voltage stress can be sequentially applied to all word lines in the DRAM chip regions and the screening test for defective memory cells on the wafer can be carried out.

Taking it into consideration that a number of chip regions on the wafer are obtained at once, and so as to enable the screening test for defective memory cells, or that the screening test is carried out for defective memory cells in all the chip regions on the wafer at once, it is desirable that the needle of the probe card is simply and reliably brought into contact with the second pad 12, which is not used for assembly, even in a chip which is out of view of a microscope. To do this, the second pad 12 has only to be formed larger than the first pad 11 which is used for assembly.

Figure 2:
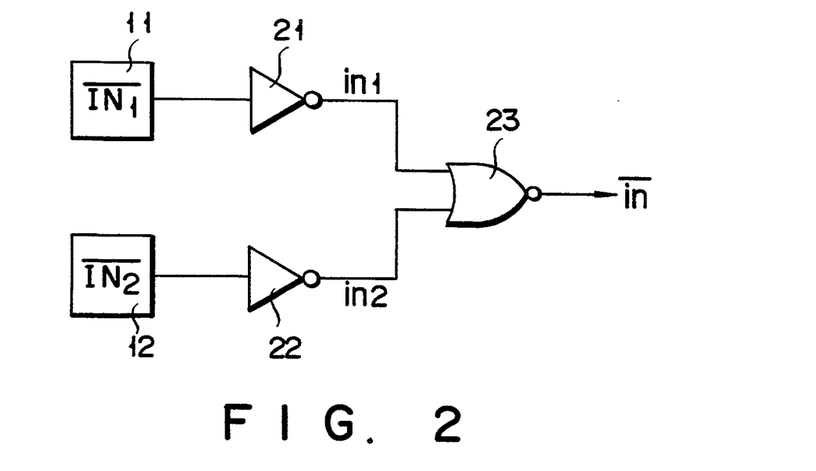
FIG. 2 is a circuit diagram partially showing a DRAM according to a second embodiment of the present invention.

FIG. 2 is a circuit diagram partially showing a DRAM according to the second embodiment of the present invention.

As shown in FIG. 2, the first and second pads 11 and 12 are connected to their corresponding first and second input buffer circuits (e.g., inverter circuits 21 and 22 to receive input signals $\overline{IN1}$ and $\overline{IN2}$, respectively. Output signals in1 and in2 of the first and second input buffer circuits 21 and 22 are supplied to a logic circuit (e.g., NOR gate circuit) 23. An output signal of the logic circuit 23 is then supplied to the internal circuit of the DRAM as an input signal.

The DRAM having the circuit shown in FIG. 2 has the same advantage as that of the DRAM shown in FIG. 1. Further, since the two pads 11 and 12 are not connected to their common input buffer circuit but to different input buffer circuits 21 and 22, the capacitance of the pads 11 and 12 is separated and therefore these pads are not affected by each other.

Figure 3:
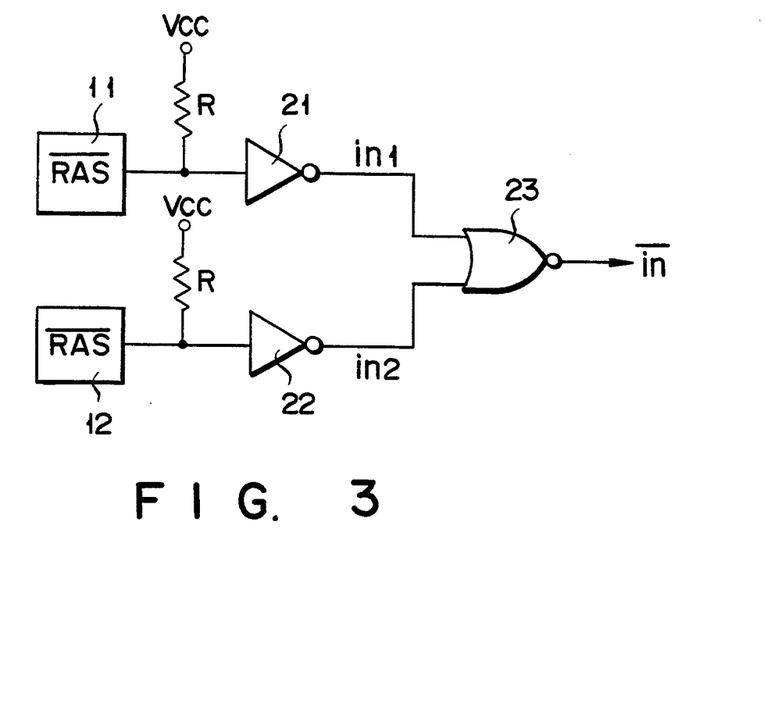
FIGS. 3 to 7 are circuit diagrams partially showing DRAMs according to third to seventh embodiments of the present invention, respectively.

FIG. 3 is a circuit diagram partially showing a DRAM according to the third embodiment of the present invention.

A resistor R having high resistance is connected between a high potential node (e.g., power supply potential $V_{CC}$) and each of the pads 11 and 12 receiving a control signal (RAS), the high level "H" of which represents a standby state and the low level "L" of which represents an active state. It is thus possible to prevent one of the pads having the same function, which is used, from adversely influencing the other pad.

When the control signal is input to the pads 11 and 12, the resistor R can be connected between a low potential node (e.g., ground potential $V_{SS}$) and each of the pads 11 and 12.

Figure 4:
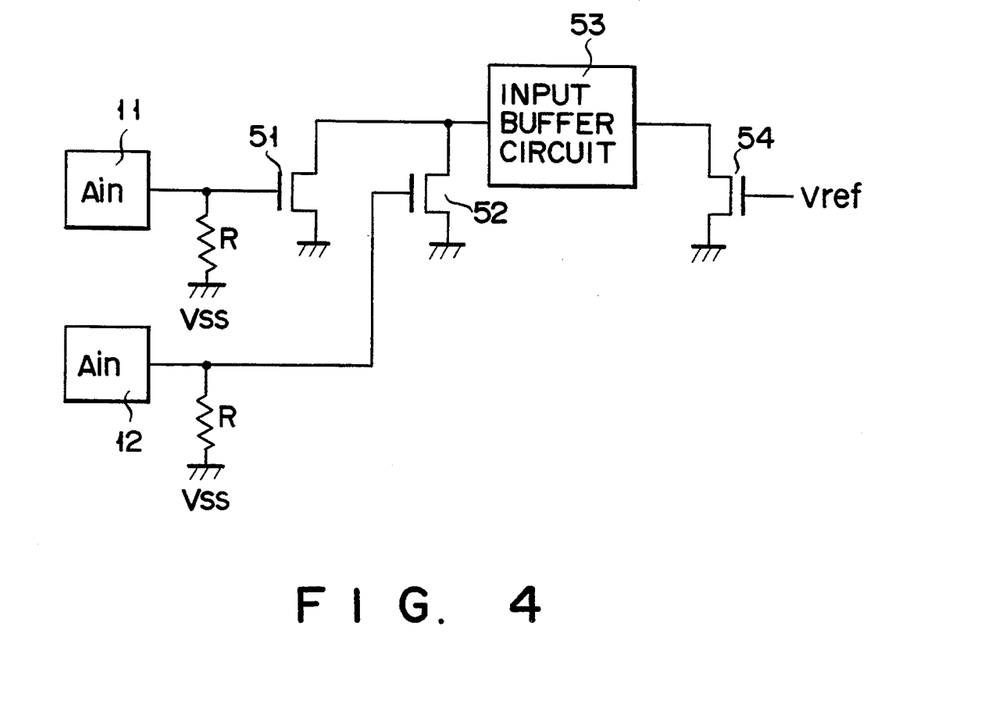

Signal terminals receiving a signal (e.g., address signal) whose high and low levels "H" and "L" correspond to "1" and "0" respectively, can be used in a circuit as shown in FIG. 4.

FIG. 4 is a circuit diagram partially showing a DRAM according to the fourth embodiment of the present invention.

The pads 11 and 12 having the same function as that of one address terminal are each connected to the ground potential $V_{SS}$ through the resistor R, and an address signal Ain input to the pad 11 or 12 is received by the gate of n-channel enhancement type MOS transistor 51 or 52 and then supplied to an input buffer circuit 53. The sources of the MOS transistors 51 and 52 are connected to the ground potential $V_{SS}$, and the drains thereof are connected in common to an input terminal of the input buffer circuit 53.

When a differential amplifier circuit is used as the input buffer circuit 53, the drains of the transistors 51 and 52 are connected together to one of input terminals of the differential amplifier circuit. The drain of another n-channel enhancement type MOS transistor 54 is connected to the other input terminal of the differential amplifier circuit, and a reference potential Vref, which is set between the high and low levels "H" and "L", is connected to the gate of the MOS transistor 54.

In the circuit shown in FIG. 4, the pads 11 and 12 have only to be connected to the power supply potential $V_{CC}$ through the resistor R in order to receive the address signal Ain by the gate of a p-channel enhancement type MOS transistor and then supply it to the input buffer circuit.

Figure 5:
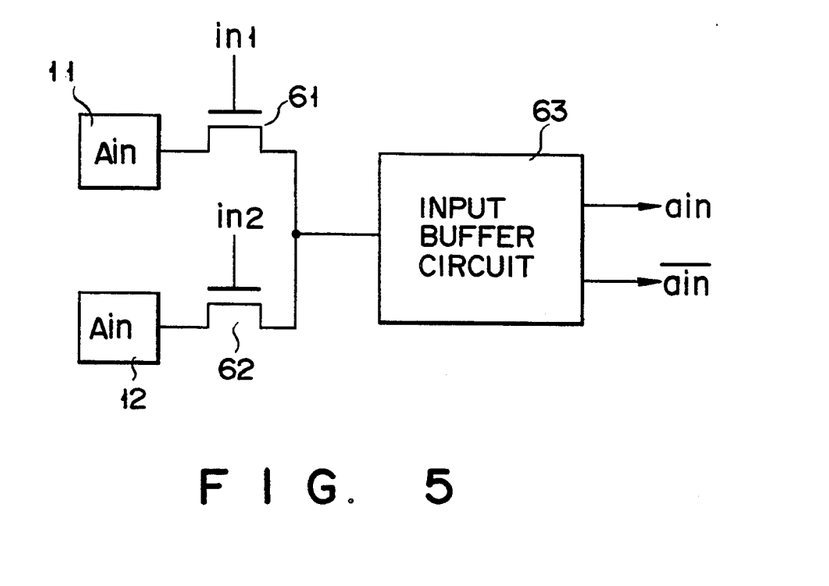
Figure 6:
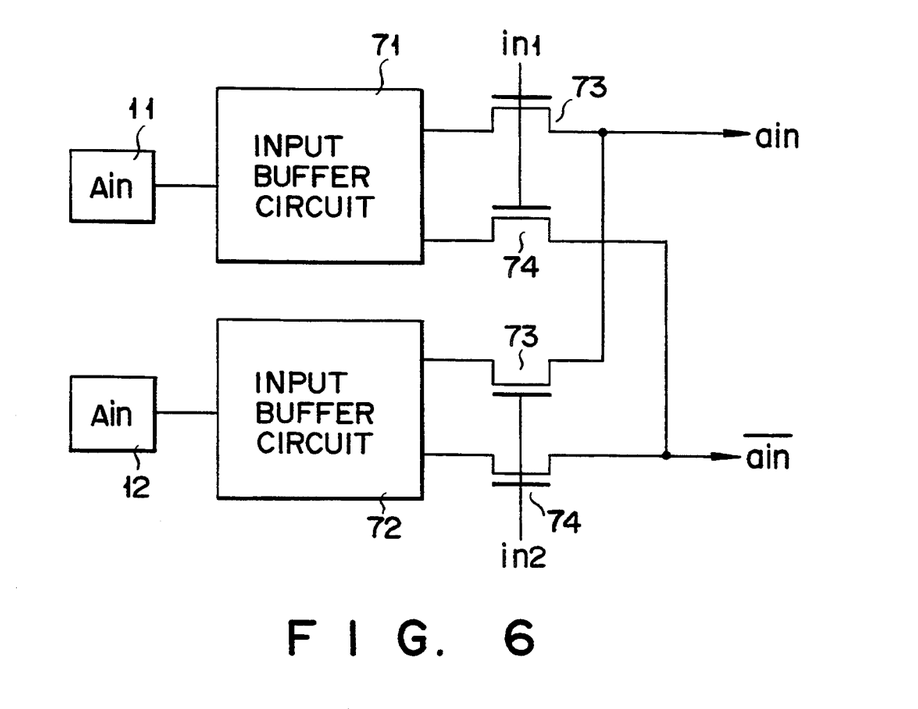

The adverse influence of one of the pads, which is not used, on the other pad can be prevented by the circuits shown in FIGS. 5 and 6 as well as in FIGS. 3 and 4.

FIG. 5 is a circuit diagram partially showing a DRAM according to the fifth embodiment of the present invention.

The pads 11 and 12 having the same function as that of one of address terminals, are connected together to an input terminal of an input buffer circuit 63 through switching elements such as transfer gates 61 and 62, corresponding to the pads, respectively, and output signals ain and $\overline{ain}$, which are complementary to each other, are input to the internal circuit of the DRAM, such as an address decoder. The transfer gates 61 and 62 are selectively turned on. To control these transfer gates, signals input to the pads (not shown) having the same function as that of a signal terminal (not shown) other than the address terminal corresponding to the pads 11 and 12, can be used before the signals are combined together. More specifically, the control signals in1 and in2 shown in FIGS. 2 and 3 or another signal produced from these control signals can be used.

FIG. 6 is a circuit diagram partially showing a DRAM according to the sixth embodiment of the present invention.

The pads 11 and 12 having the same function as that of one of address terminals are connected to their corresponding input buffer circuits 71 and 72, and output signals of the input buffer circuits, which are complementary to each other, are supplied through switching elements such as transfer gates 73 and 74 and combined together. The combined signals ain and $\overline{ain}$ are input to the internal circuit of the DRAM.

In the circuits shown in FIGS. 5 and 6, the transfer gates 61, 62, 73 and 74 can be replaced with the other switching elements such as CMOS clocked inverter circuits.

Figure 7:
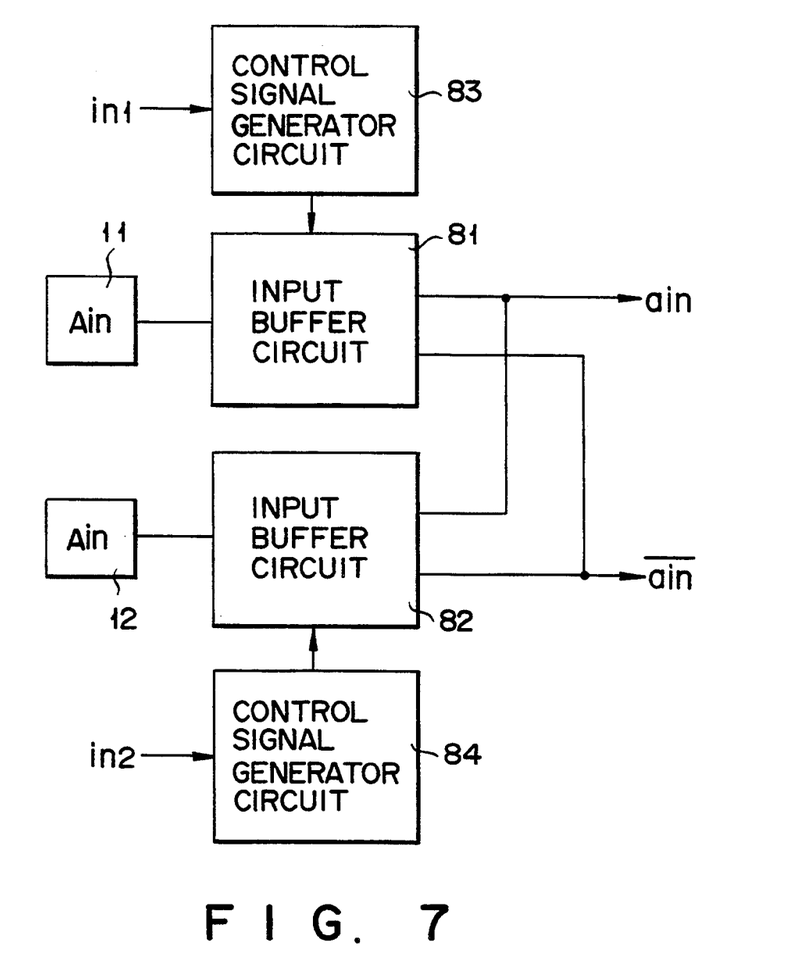

FIG. 7 is a circuit diagram partially showing a DRAM according to the seventh embodiment of the present invention.

In FIG. 7, reference numerals 81 and 82 denote input buffer circuits which are provided so as to correspond to the pads 11 and 12 having the same function as that of one of address terminals, and numerals 83 and 84 indicate control signal generator circuits for generating a control signal for separately controlling the active/inactive states of the input buffer circuits 81 and 82.

Figure 8:
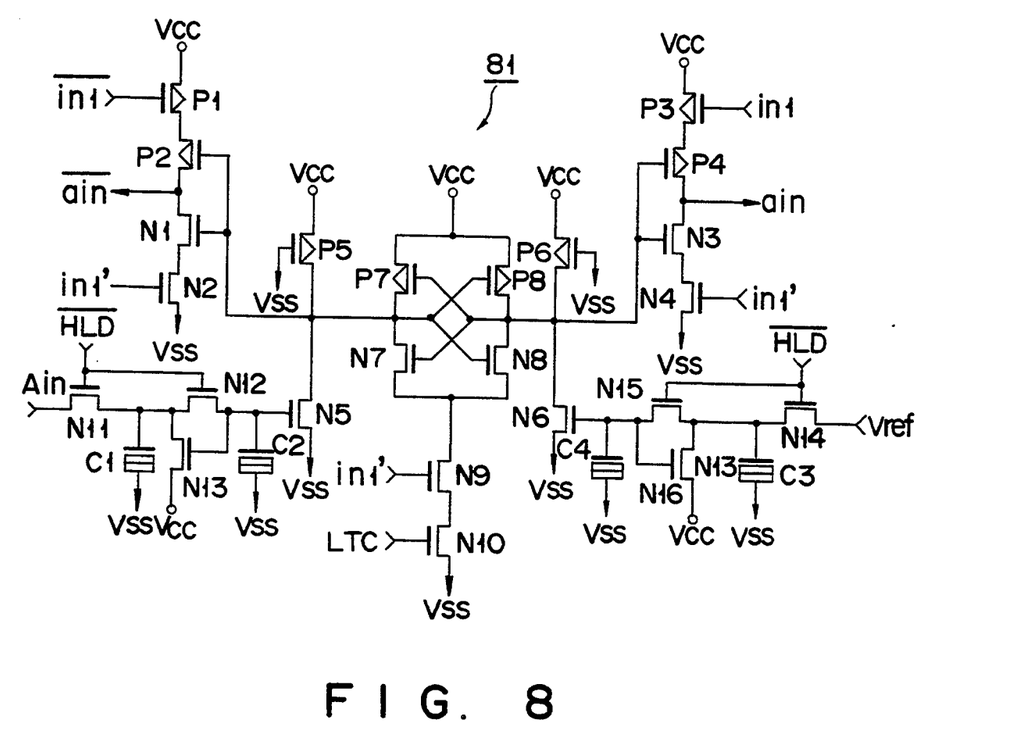
FIG. 8 is a circuit diagram specifically showing an input buffer of the DRAM shown in FIG. 7.

FIG. 8 is a circuit diagram specifically showing the input buffer circuit 81 shown in FIG. 7.

In FIG. 8, reference numerals P1 to P8 indicate P-channel MOS transistors; N1 to N16, N-channel MOS transistors; C1 to C4, MOS capacitors each having $V_{SS}$ potential to which the drain and source of each N-channel MOS transistor are connected in common; SA, a differential CMOS sense amplifier; Ain, an input signal; Vref, reference potential; $\overline{in1}$, in1', and $\overline{HLD}$, gate control signals; LTC, a sense amplifier activation (latch) control signal; and ain and ain, output signals which are complementary to each other.

Figure 9:
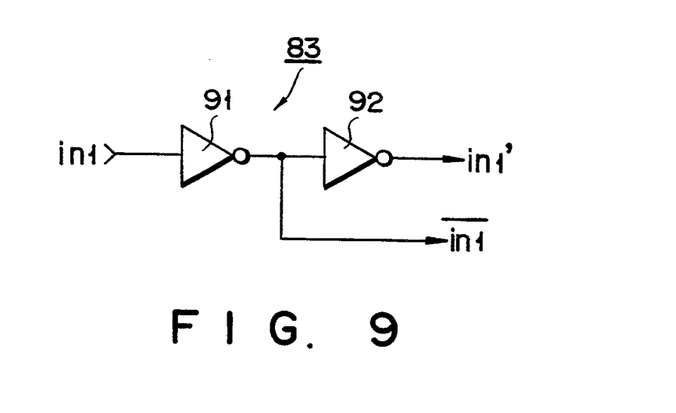
FIG. 9 is a circuit diagram specifically showing a control signal generator circuit of the DRAM shown in FIG. 7.

FIG. 9 is a circuit diagram showing the control signal generator circuit 83 shown in FIG. 7. The control signal generator circuit generates the control signals $\overline{in1}$ and in1'. In FIG. 9, reference numerals 91 and 92 denote CMOS inverter circuits, and in1 indicates the control signals as shown in, for example, FIGS. 2 and 3. The signal in1' is signal in1 after passing through inverter circuits 91 and 92 as shown in FIG. 9.

In the circuit illustrated in FIG. 7, if the input buffer circuit connected to one of the pads which receives an input signal is rendered in an active state and the input buffer circuit connected to the other which receive no input signal is rendered in an inactive state, power consumption can be reduced. Since the input buffer circuit rendered in the inactive state is so constructed that its output has high impedance, even if the output terminals of the input buffer circuits 81 and 82 are directly connected to each other, the output signals of the input buffer circuits do not adversely affect each other.

Figure 10:
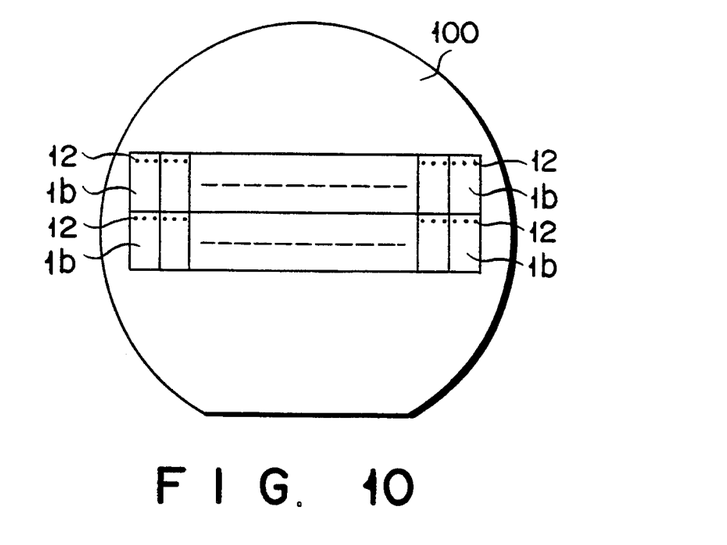
FIG. 10 is a view showing the arrangement of bonding pads on a chip of a DRAM according to an eighth embodiment of the present invention.

FIG. 10 is a view showing the arrangement of bonding pads on a chip of a DRAM according to an eighth embodiment of the present invention.

In FIG. 10, reference numeral 100 indicates a wafer and numeral 1b denotes DRAM chip regions on the wafer. A plurality of pads having the same function is formed on each of the chip regions 1b so as to correspond to a plurality of terminals other than the power supply terminals, and a group of pads 12 of these pads, which are not used for assembly, are locally arranged on one side of the chip region 1b. The arrangement of the group of pads 12 not used for assembly is favorable for the screening test for defective memory cells on the wafer using a probe card, or the arrangement makes it easy to fabricate the probe card used for the screening test and to obtain a number of chip regions when the screening test for defective memory cells on the wafer is carried out.

Figure 11:
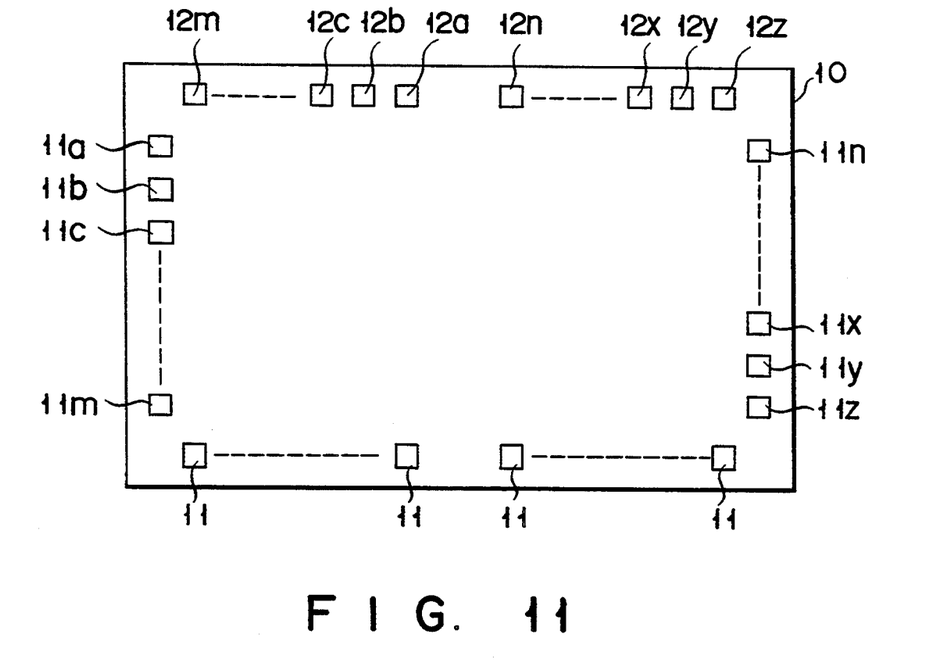
FIG. 11 is a view showing the arrangement of bonding pads on a chip region of the wafer of a DRAM according to a ninth embodiment of the present invention.

FIG. 11 is a view showing the arrangement of bonding pads on a chip region of the wafer of a DRAM according to a ninth embodiment of the present invention.

A plurality of pairs of pads (11a, 12a), (11b, 12b), (11c, 12c), ..., (11x, 12x), (11y, 12y), and (11z, 12z) is formed on a chip 10 of the DRAM so as to correspond to a plurality of terminals of a grouped terminals other than the power supply terminal. One group of pads 11a, 11b, 11c, ..., 11x, 11y, and 11z are arranged on opposing sides of the chip, and the other group of pads 12a, 12b, 12c, ..., 12x, 12y, and 12z are arranged on another side of the chip.

In order to house the chip 10 of the DRAM in a small outline J-lead (SOJ) package, the pads 11a, 11b, 11c, ..., 11x, 11y, and 11z are used in a test or an operation other than the die sort test performed from the end of the wafer manufacture process to the assembly, and the pads 12a, 12b, 12c, ..., 12x, 12y, and 12z are used for the assembly. To house the chip 10 of the DRAM in a zigzag in-line package (ZIP), the pads 12a, 12b, 12c, ..., 12x, 12y, and 12z are used in the test or operation other than the die sort test performed from the end of the wafer manufacture process to the assembly, and the pads 11a, 11b, 11c, ..., 11x, 11y, and 11z are used for assembly.

According to the chip 10 of the DRAM shown in FIG. 11, the shape of the package meets the standards for the arrangement of external terminals in the SOJ ZIP.

If the shape of a package in which a chip on a wafer is housed has not been determined, three pads having the same function have only to be provided in accordance with the arrangement of the bonding pads shown FIG. 11. One of the three pads is used in the test or operation other than the die sort test performed from the end of the wafer manufacture process to the assembly, and one of the other two pads is used for the assembly. The chip can thus be housed in the SOJ or ZIP.

As described above, the semiconductor device according to the present invention is provided with a plurality of pads having the same function. Therefore, at least one of the pads can be used in the test or operation other than the die sort test performed from the end of the wafer manufacture process to the assembly and cannot be used for the assembly.

Consequently, the number of times of contact of the needle of a probe card with the pads used for assembly is less than that in the conventional semiconductor device. The yield of the assembly can thus be improved.

In the semiconductor device according to the present invention, when a single chip in a plurality of kinds of packages, a plurality of pads having the same function can be arranged so as to facilitate the arrangement of terminals of each package, so that the layout of leads of the package need not be unnecessarily contrived and, in this respect, the yield of assembly can be improved.

The pads, which are not used for assembly, can be arranged in each of the chip regions. If the chip regions have the pads in common, a number of chip regions can be more easily obtained when the screening test for defective memory cells on the wafer is carried out. It is usual in this case that plural chip regions, which are exposed together by a wafer pattern exposure device such as a stepper, have in common pads not used for assembly. However, all the chip regions on the wafer have in common the pads not used for the assembly.

The technique of forming a plurality of bonding pads serving as power supply terminals on an integrated circuit chip is disclosed in Nicky C. C. Lu et al, "A 20-ns 128 Kbit*4 High-Speed DRAM with 330-Mbit/s Data Rate," IEEE Journal of Solid-State Circuits, Vol. 23, No. 5, October, 1988, p.1142. The technique aims at decreasing the noise caused at power supply potential ($V_{CC}$, $V_{SS}$) by high-speed operation and thus differs from the subject matter of the present invention.

The present invention is not limited to the above-described embodiments. Various changes and modifications to the present invention can be made without departing from the scope of the invention.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device comprising:
   a first bonding pad which receives a signal during a test of said device;
   a second bonding pad which is used during the assembly process of said device, said first and second bonding pads comprising a first group of pads;
   an input buffer circuit having an input coupled to said first and second bonding pads and an output coupled to a remaining portion of said semiconductor device;
   a bonding pad serving as a power supply terminal;
   first and second n-channel enhancement type MOS transistors each having gates which are connected to said first and second bonding pads respectively, having sources which are connected to a ground potential, and having drains which are connected to said input of said input buffer circuit; and
   first and second resistors each having a high resistance and connected between said first and second bonding pads respectively and the ground potential.

2. A semiconductor device according to claim 1, wherein said input buffer circuit is a differential amplifier circuit having a first input which is connected to the drains of said first and second MOS transistors, and a third n-channel enhancement type MOS transistor having a drain connected to a second input of said differential amplifier circuit and a gate of said third MOS transistor which is connected to a reference potential.

3. A semiconductor device comprising:
   a first bonding pad;
   a second bonding pad, said first and second bonding pads comprising a first group of pads;
   an input buffer circuit having an input coupled to said first and second bonding pads and an output coupled to a remaining portion of said semiconductor device;
   a bonding pad serving as a power supply terminal; and
   first and second switching elements connected between said first and second bonding pads respectively and the input of said buffer circuit, said switching elements controlled so as to be selectively turned on.

4. A semiconductor device comprising:
   a first bonding pad;
   a second bonding pad, said first and second bonding pads comprising a first group of pads;
   a first input buffer circuit having an input coupled to said first bonding pad;
   a second input buffer circuit having an input coupled to said second bonding pad;
   a logic circuit having inputs coupled to outputs of said buffer circuits, and an output coupled to a remaining portion of said semiconductor device;
   a bonding pad serving as a power supply terminal; and
   first and second resistors each having a high resistance and connected between said first and second bonding pads respectively and one of power supply potential or ground potential.

5. A semiconductor device comprising:
   a first bonding pad;
   a second bonding pad, said first and second bonding pads comprising a first group of pads;
   a first input buffer circuit having an input coupled to said first bonding pad, and first and second outputs which are complementary to each other;
   a second input buffer circuit having an input coupled to said second bonding pad, and first and second outputs which are complementary to each other;
   a plurality of first switching elements, having first ends which are connected to said first outputs of said first and second input buffer circuits respectively, and having second ends which are connected together; and
   a plurality of second switching elements, having first ends which are connected to said second outputs of said first and second input buffer circuits respectively, and having second ends which are connected together,
   wherein said first bonding pad is connected to a signal during a test of said device, and said second bonding pad is used during an assembly process of said device.

6. A semiconductor device comprising:
   a first bonding pad;
   a second bonding pad, said first and second bonding pads comprising a first group of pads;
   a first input buffer circuit having an input coupled to said first bonding pad;
   a second input buffer circuit having an input coupled to said second bonding pad;
   a logic circuit having inputs coupled to outputs of said buffer circuits, and an output coupled to a remaining portion of said semiconductor device;
   a bonding pad serving as a power supply terminal; and
   control signal generator circuits for respectively generating control signals to separately control active/inactive states of said first and second input buffer circuits.

7. A semiconductor device according to claim 6, wherein said outputs of said first and second input buffer circuits have high impedance when said first and second input buffer circuits are rendered in the inactive state, and respective outputs of said first and second input buffer circuits are directly connected to each other.

8. A semiconductor device comprising:
   a first bonding pad;
   a second bonding pad, said first and second bonding pads comprising a first group of pads;
   a first input buffer circuit having an input coupled to said first bonding pad;
   a second input buffer circuit having an input coupled to said second bonding pad;
   a logic circuit having inputs coupled to outputs of said buffer circuits, and an output coupled to a remaining portion of said semiconductor device;
   a bonding pad serving as a power supply terminal,
   wherein said first bonding pad is connected to a signal during a test of said device, and said second bonding pad is used during an assembly process of said device.

9. A semiconductor device according to any one of claims 1, 2, 3, 4, 5, 6 and 8, wherein said first bonding pad used during said stress test is larger than said second bonding pad used for said assembly.

10. A semiconductor device according to any one of claims 1, 2, 3, 4, 5, 6 and 8, further comprising a group of bonding pads formed so as to correspond to the grouped terminals other than said power supply terminal, said group of bonding pads including a group of said first bonding pads which are not used for assembly and locally arranged on one side of a semiconductor chip.

11. A semiconductor device according to any one of claims 1, 2, 3, 4, 5, 6 and 8, further comprising a plurality of paired bonding pads having a same function and formed so as to correspond to the grouped terminals other than said power supply terminal, said plurality of paired bonding pads including one group of pads arranged on opposing sides of a semiconductor chip and used for assembly when the semiconductor chip is housed in a ZIP package and another group of pads arranged on another side of the semiconductor chip and used for assembly when the semiconductor chip is housed in an SOJ package.

12. A semiconductor device according to any one of claims 1, 2, 3, 4, 5, 6 and 8, wherein said first bonding pad is included in a plurality of chip regions when said semiconductor device is shaped like a wafer.

13. A semiconductor device according to any one of claims 1, 2, 3, 4, 5, 6 and 8, wherein said first bonding pad receives a signal during said test prior to assembly of the device, and the second bonding pad receives said signal during operation of said device after the assembly.

14. A semiconductor device according to claim 12, wherein said plurality of chip regions are exposed together by a wafer pattern exposure device.

15. A semiconductor device according to claim 14, wherein said plurality of chip regions are all formed on the wafer.

16. A semiconductor device, comprising:
a first bonding pad which receives a signal during a test of said device;
a second bonding pad which is used during an assembly process of said device, said first and second bonding pads comprising a first group of pads;
an input buffer circuit having an input coupled to said first and second bonding pads and an output coupled to a remaining portion of said semiconductor device; and
a bonding pad serving as a power supply terminal, wherein said first bonding pad is larger than said second bonding pad.

17. A semiconductor device comprising:
a first bonding pad which receives a signal during a test of said device;
a second bonding pad which is used during an assembly process of said device, said first and second bonding pads comprising a first group of pads;
an input buffer circuit having an input coupled to said first and second bonding pads and an output coupled to a remaining portion of said semiconductor device;
a bonding pad serving as a power supply terminal; and
a plurality of paired bonding pads having a same function and formed so as to correspond to the grouped pads other than said power supply terminal, said plurality of paired bonding pads including one group of pads arranged on one side of a semiconductor chip and used for assembly when the semiconductor chip is housed in a ZIP package and another group of pads arranged on a second opposed side of the semiconductor chip and used for assembly when the semiconductor chip is housed in an SOJ package.

18. A semiconductor device comprising:
a dynamic random access memory (DRAM) circuit;
one first bonding pad which receives a row address strobe (RAS) control signal during a test of said DRAM circuit;
one second bonding pad which is used during an assembly process of said device; and
a first input buffer circuit having an input coupled to said one first and said one second bonding pads and an output coupled to said DRAM circuit.

19. A semiconductor device according to claim 18, further comprising:
another first bonding pad which receives a column address strobe (CAS) control signal during the test of said DRAM circuit;
another second bonding pad which is used during the assembly process of said device; and
a second input buffer circuit having an input coupled to said another first and said another second bonding pads and output coupled to said DRAM circuit.

20. A semiconductor device according to claim 19, wherein said test is a voltage stress test of said DRAM circuit.

21. A semiconductor device according to claim 19, wherein said test includes a voltage stress test and a die sort test which are carried out when said semiconductor device is in a wafer state.

22. A semiconductor device according to claim 19, wherein said one first and said another first bonding pads are locally arranged on one side of a semiconductor chip.

23. A semiconductor device according to claim 18, wherein said test is a voltage stress test of said DRAM circuit.

24. A semiconductor device according to claim 18, wherein said test includes a voltage stress test and a die sort test which are carried out when said semiconductor device is in a wafer state.

* * * * *